(12) United States Patent
Sandhu

(10) Patent No.: US 8,372,481 B2
(45) Date of Patent: Feb. 12, 2013

(54) METHODS OF FORMING MATERIAL ON A SUBSTRATE, AND A METHOD OF FORMING A FIELD EFFECT TRANSISTOR GATE OXIDE ON A SUBSTRATE

(76) Inventor: Gurtej S. Sandhu, Boise, ID (US)

( * ) Notice: Subject to any disclaimer, the term of this patent is extended or adjusted under 35 U.S.C. 154(b) by 0 days.

(21) Appl. No.: 13/251,992

(22) Filed: Oct. 3, 2011

(65) Prior Publication Data

US 2012/0021610 A1    Jan. 26, 2012

Related U.S. Application Data

(60) Continuation of application No. 11/257,946, filed on Oct. 24, 2005, now Pat. No. 8,029,858, which is a division of application No. 10/636,038, filed on Aug. 6, 2003, now Pat. No. 7,258,895.

(51) Int. Cl.
*C23C 16/00* (2006.01)

(52) U.S. Cl. ............ 427/248.1; 438/758; 438/759

(58) Field of Classification Search .......... None
See application file for complete search history.

(56) References Cited

U.S. PATENT DOCUMENTS

| | | |
|---|---|---|
| 6,495,436 B2 | 12/2002 | Ahn et al. |
| 6,524,918 B2 | 2/2003 | Park et al. |
| 6,579,767 B2 | 6/2003 | Park et al. |
| 6,608,378 B2 | 8/2003 | Ahn et al. |
| 6,717,226 B2 | 4/2004 | Hedge et al. |
| 6,762,114 B1 | 7/2004 | Chambers |
| 7,258,895 B2 | 8/2007 | Sandhu |
| 2001/0024860 A1 | 9/2001 | Park et al. |
| 2001/0029092 A1 | 10/2001 | Park et al. |
| 2002/0098627 A1 | 7/2002 | Pomarede et al. |
| 2003/0036268 A1 | 2/2003 | Brabant et al. |
| 2003/0186515 A1 | 10/2003 | Dean et al. |
| 2003/0232506 A1 | 12/2003 | Metzner et al. |
| 2004/0023462 A1 | 2/2004 | Rotondare et al. |
| 2004/0150012 A1* | 8/2004 | Jin et al. .................. 257/255 |

OTHER PUBLICATIONS

"Characterization of Ultra-Thin HfO2 Gate Oxide prepared by Using Atomic Layer Deposition;" Taeho et al.; Journal of the Korean Physical Society. vol. 42, No. 2; Feb. 2003; pp. 272-275.
"Effect of HF Sources, Oxidizing Agents, and NH3/Ar Plasma on the Properties of HfAlOx Films Prepared by Atomic Layer Deposition;" Kawahara et al.; Japanese Journal of Applied Physics, vol. 43, No. 7A; Jul. 2004; pp. 4129-4131.
"High-kmaterials for Advanced Gate Stack Dielectrics: a Comparison of ALCVD and MOCVD as Deposition Technologies;" Caymax et al.; CMOS Front-End Materials and Process Technology Symposium (Mater, Res. Soc. Symposium Proceedings vol. 765); Apr. 22-24, 2003; 47-58.
"Surface Preparation and Post Thermal Treatment Effects on Interface Properties of Thin AL2O3 Films Deposited by ALD", Chang et al.; Microelectric Engineering 72, 2004; pp. 326-331.
Effect Purge Time on the Properties of HFO2 Films Prepared by Atomic Layer Deposition; Kawahara et al.; IELEEJ Transactions on Electronics; vol. E87-C, No. 1; Jan. 2004; pp. 2-8. S.M. George, Atomic Layer Controlled Deposition of SiO2 and Al2O3 using Abab . . . Binary Reaction Sequence Chemistry, Elsevier Science B.V., Applied Surface Science 82/83, 1994, p. 460-467.

* cited by examiner

*Primary Examiner* — Joseph Miller, Jr.

(57) ABSTRACT

The invention includes methods of forming material on a substrate and methods of forming a field effect transistor gate oxide. In one implementation, a first species monolayer is chemisorbed onto a substrate within a chamber from a gaseous first precursor. The first species monolayer is discontinuously formed over the substrate. The substrate having the discontinuous first species monolayer is exposed to a gaseous second precursor different from the first precursor effective to react with the first species to form a second species monolayer, and effective to form a reaction product of the second precursor with substrate material not covered by the first species monolayer. The substrate having the second species monolayer and the reaction product is exposed to a third gaseous substance different from the first and second precursors effective to selectively remove the reaction product from the substrate relative to the second species monolayer. Other implementations are contemplated.

8 Claims, 2 Drawing Sheets

METHODS OF FORMING MATERIAL ON A SUBSTRATE, AND A METHOD OF FORMING A FIELD EFFECT TRANSISTOR GATE OXIDE ON A SUBSTRATE

RELATED PATENT DATA

This patent resulted from a continuation of U.S. patent application Ser. No. 11/257,946, which was filed on Oct. 24, 2005, now U.S. Pat. No. 8,029,858, and which is a divisional of U.S. patent application Ser. No. 10/636,038, which was filed on Aug. 6, 2003, now U.S. Pat. No. 7,258,895, and which is incorporated by reference herein.

TECHNICAL FIELD

This invention relates to methods of forming material on a substrate and to methods of forming a field effect transistor gate oxide on a substrate.

BACKGROUND OF THE INVENTION

A continuing goal in integrated circuitry design is to make ever denser, and therefore smaller, circuit devices. This results in thinner layers and smaller geometries. Further, new deposition techniques and materials are constantly being developed to enable circuit devices to be made smaller than the previous generation.

One common circuitry device is a field effect transistor. Such includes a pair of conductive source/drain regions having a semiconductive channel region received therebetween. A conductive gate is received proximate the channel region, with a gate dielectric layer being received between the gate and the channel region. Application of a suitable voltage potential to the gate enables current to flow between the source/drain regions, with the transistor being capable of essentially functioning as a switch.

A common material for the gate dielectric layer is silicon dioxide. However as device geometry continues to shrink, the thinness of the gate dielectric layer will likely preclude silicon dioxide from being used as a gate dielectric material due to its too small of a dielectric constant. Accordingly, other dielectric materials with higher dielectric constants have been proposed for use as gate dielectric layers. Exemplary such materials include $Al_2O_3$ (typically having a dielectric constant of about nine), and $HfO_2$ (typically having a dielectric constant ranging from about 18 to about 25).

Even high dielectric constant materials will most likely be deposited to very thin thicknesses (for example 10 Angstroms or less) to achieve desired circuit densities. One comparatively new technique for depositing very thin layers is atomic layer deposition (ALD). Described in summary, ALD includes exposing an initial substrate to a first gaseous precursor-chemical species to accomplish chemisorption of the species onto the substrate. Ideally, the chemisorption would form a monolayer that is uniformly one atom or molecule thick on the entire exposed initial substrate. Alternately considered and desirably, a saturated monolayer is formed. However more typically, chemisorption does not occur on all portions of the substrate such that the monolayer is discontinuously formed thereover. Nevertheless, such a monolayer is still considered a monolayer in the context of this document.

The first chemical precursor is purged from the substrate and a second gaseous precursor is provided to enable a second species to chemisorb onto and with the first monolayer. Any remaining of the second gaseous precursor is then purged and the steps are repeated, with exposure of the second species monolayer to the first gaseous precursor. In some instances, the two monolayers may be of the same species. Also, a third species or more from additional gaseous precursors may be successively chemisorbed and purged, as described for the first and second precursors. Further, it is noted that one or more of the first, second and third precursors can be mixed with an inert gas to speed up pressure saturation within a reaction chamber. Purging may involve a variety of techniques including, but not limited to, contacting the substrate and/or monolayer with a carrier gas and/or lowering pressure.

ALD is often described as a self-limiting process in that a finite number of sites exist on a substrate to which the first species may form chemical bonds. The second species might only bond to the first species, and thus may also be self-limiting. Once all of the finite number of cites on a substrate are bonded with the first species, the first species will often not bond to other of the first species already bonded with the substrate.

One common semiconductive channel material is silicon, for example monocrystalline and/or polycrystalline silicon. When forming $HfO_2$ or $Al_2O_3$ by ALD, the second gaseous precursor will typically contain oxygen, for example $O_2$, $O_3$ and/or $H_2O$. In many instances, exposure of a silicon channel to a first species containing hafnium or aluminum will not completely saturate (meaning cover) all of the exposed silicon surface. Accordingly, at the conclusion of a purge cycle, some silicon will still typically be outwardly exposed. Typically, exposure of this exposed silicon to an oxygen containing precursor will undesirably form silicon dioxide from the exposed substrate material, as well as create hafnium oxide or aluminum oxide from the discontinuously adhered monolayer. The result can be the formation of undesired silicon dioxide in combination with the hafnium oxide and/or aluminum oxide. This can result in an unacceptable lowering of the dielectric constant of the layer being formed, precluding its use in very thin gate dielectric layers.

While the invention was motivated in addressing the above-identified issues, it is in no way so limited. The invention is only by the accompanying claims as literally worded, without interpretative or other limiting reference to the specification, and in accordance with the doctrine of equivalents.

SUMMARY

The invention includes methods of forming material on a substrate and methods of forming a field effect transistor gate oxide on a substrate. In one implementation, a method of forming material on a substrate includes positioning a substrate within a deposition chamber. A first species monolayer is chemisorbed onto the substrate within the chamber from a gaseous first precursor. The first species monolayer is discontinuously formed over the substrate. The substrate having the discontinuous first species monolayer is exposed to a gaseous second precursor different from the first precursor effective to react with the first species to form a second species monolayer, and effective to form a reaction product of the second precursor with substrate material not covered by the first species monolayer. The substrate having the second species monolayer and the reaction product is exposed to a third gaseous substance different from the first and second precursors effective to selectively remove the reaction product from the substrate relative to the second species monolayer.

In one implementation, a method of forming material on a substrate includes positioning a substrate within a deposition chamber. A first species monolayer is chemisorbed onto the substrate within the chamber from a gaseous precursor "a".

The substrate having the first species monolayer is exposed to a gaseous precursor "b" different from precursor "a" effective to react with the first species to form a second species monolayer. The exposing leaves some undesired impurity remaining on the substrate. The substrate having the undesired impurity is exposed to a gaseous substance "c" different from the precursors "a" and "b" effective to selectively remove the undesired impurity from the substrate relative to the second species monolayer.

Other aspects and implementations are contemplated.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

The invention includes methods of forming material on a substrate, and in one preferred embodiment, methods of forming a field effect transistor gate oxide on a substrate. A substrate to be deposited upon would be positioned within any suitable deposition chamber, whether existing or yet-to-be developed. Any suitable chamber can be utilized, whether hot or cold walled, with subatmospheric chambers being most preferred. An exemplary typical deposition chamber would be a single wafer processor having a plurality of gas inlets which feed to a showerhead positioned to be received over a substrate to be deposited upon. One exemplary substrate is a semiconductive substrate, for example a bulk monocrystalline silicon wafer. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Figure 1:
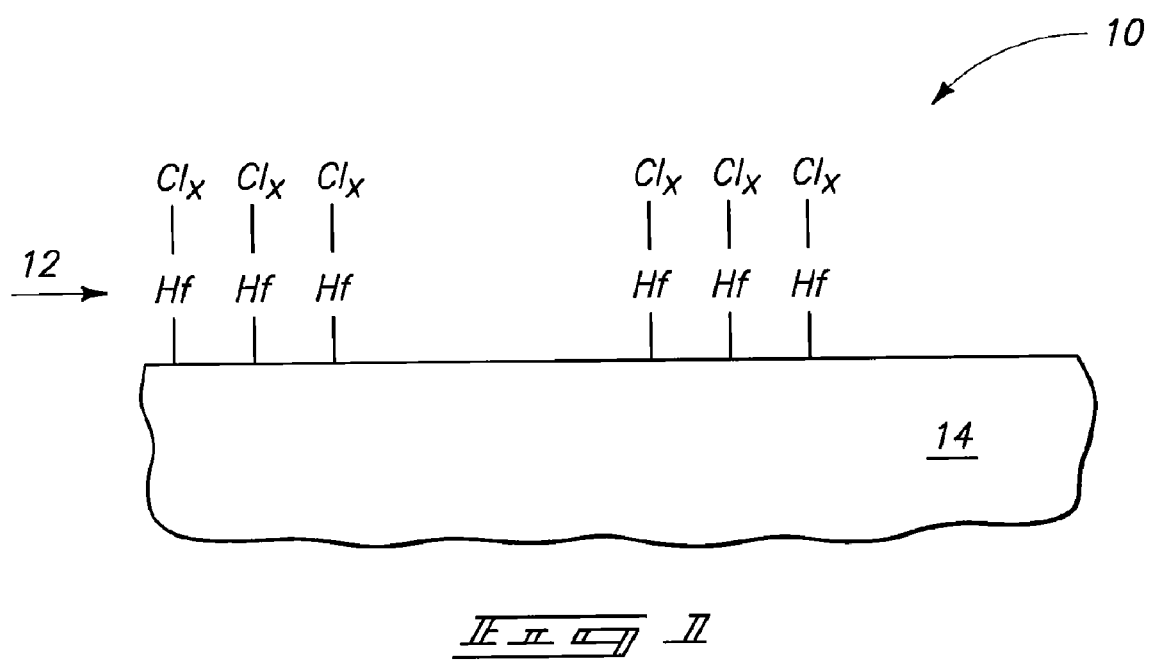
FIG. 1 is a diagrammatic view of a substrate at a processing step in accordance with an aspect of the invention.

In one implementation, a first species monolayer is chemisorbed onto the substrate within the chamber from a gaseous first precursor, with the first species monolayer being discontinuously formed over the substrate. A preferred example is a metal containing first species monolayer. By way of example only, FIG. 1 diagrammatically depicts a substrate 10 having a first species monolayer 12 discontinuously formed thereover. In the exemplary described example, substrate 10 comprises substrate material 14 which, in one preferred embodiment, will comprise a channel region of a field effect transistor being formed. The material being deposited thereover will form a field effect transistor gate oxide. An exemplary preferred material 14 is monocrystalline or polycrystalline silicon. In the depicted example, a first species monolayer in the form of $HfCl_x$ is discontinuously adhered to substrate material 14. Such can result from suitable exposure of substrate 14 to $HfCl_x$, with "x" in such case being less than 5. Accordingly in this example, the gaseous first precursor and the first species monolayer comprise hafnium. By way of example only, an alternate example would include a gaseous first precursor and first species monolayer comprising aluminum. For example, exposing a suitable substrate to trimethylaluminum ($Al[CH_3]_3$) can leave a discontinuous first species monolayer comprising $Al(CH_3)_x$.

Figure 2:
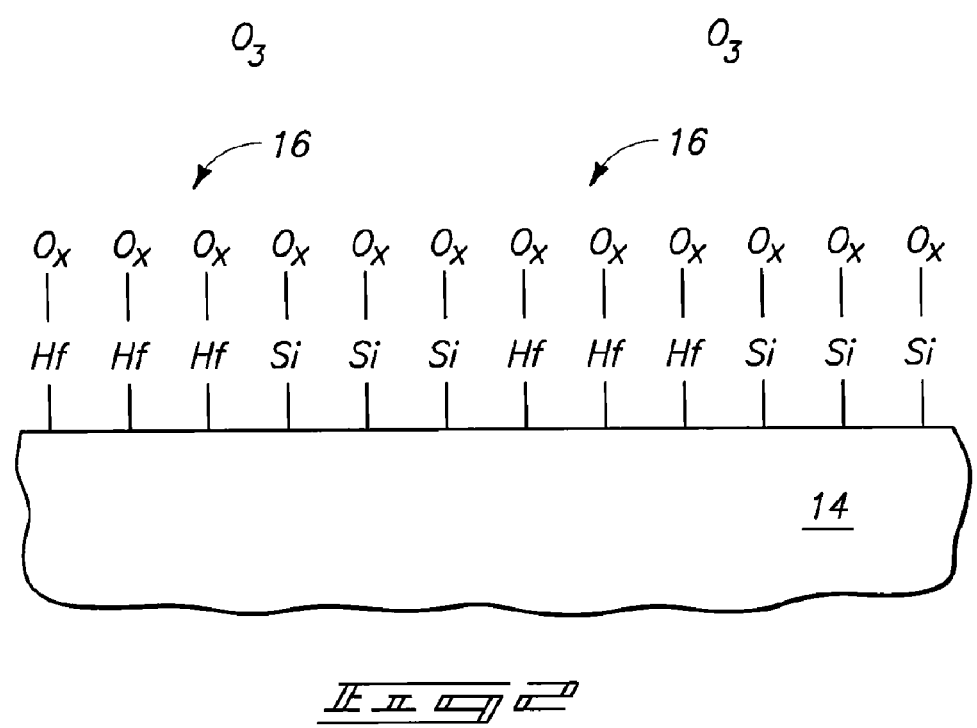
FIG. 2 is a view of the FIG. 1 substrate at a processing step subsequent to that shown by FIG. 1.

The substrate having the discontinuous first species monolayer is exposed to a gaseous second precursor different from the first precursor effective to react with the first species to form a second species monolayer, and effective to form a reaction product of the second precursor with substrate material not covered by the first species monolayer. For example, FIG. 2 illustrates exposure of the substrate to a gaseous oxygen containing second precursor $O_3$ forming a second species monolayer 16 in the form of $HfO_x$ discontinuously formed over the substrate. "x" will typically be 2 or less than 2. Substrate material 14 not covered by first species monolayer 12 (FIG. 1) has reacted with the gaseous second precursor to form a reaction product in the form of a silicon oxide designated as $SiO_x$. Again, "x" will typically be 2 or less than 2. In one embodiment, the $HfO_x$ will predominately constitute the dioxide $HfO_2$, and the $SiO_x$ will typically form the dioxide form of $SiO_2$ also. In an alternate example, the reaction product might comprise a dioxide and the second species monolayer might comprise an oxide other than a dioxide. For example, where the first species monolayer comprises $Al(CH_3)_x$, the reaction product will still typically comprise $SiO_2$, and with the second species monolayer comprising $Al_2O_3$.

Figure 3:
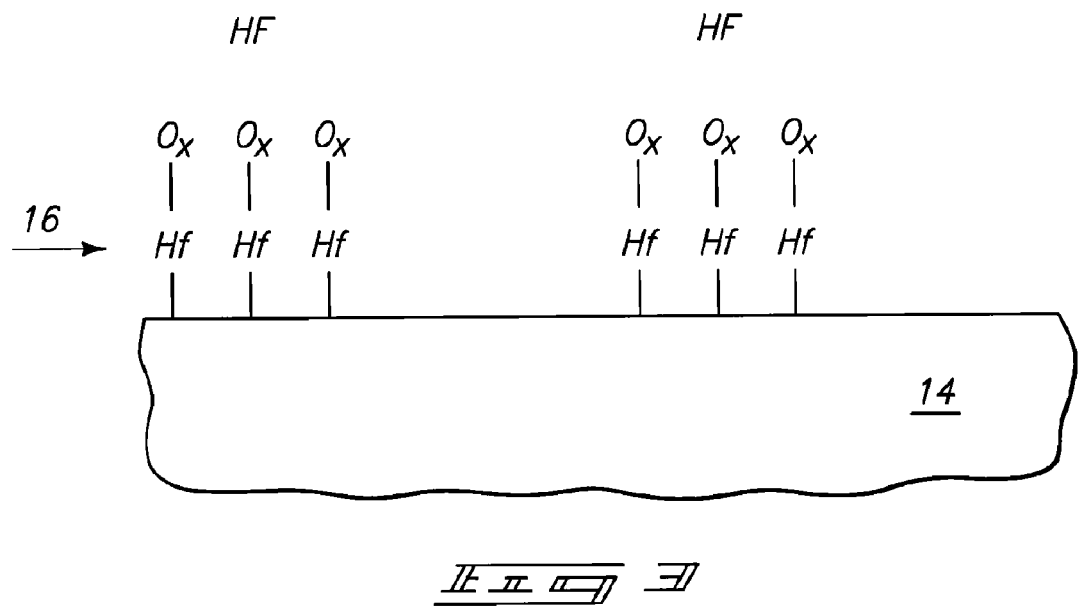
FIG. 3 is a view of the FIG. 2 substrate at a processing step subsequent to that shown by FIG. 2.

The substrate having the second species monolayer and the reaction product is exposed to a third gaseous substance different from the first and second precursors effective to selectively remove the reaction product from the substrate relative to the second species monolayer. With respect to the exemplary depicted hafnium oxide being formed, FIG. 3 illustrates exposure of the FIG. 2 substrate to such a third gaseous substance which has selectively removed the $SiO_x$ from the substrate relative to the remaining $HfO_x$. Exemplary preferred third gaseous substances to effect such selective removing includes fluorine comprising gases. Further, an example includes a halide, for example a hydrogen halide such as HF. Alternate exemplary gases include $F_2$ and $CHF_4$, by way of example only. Such materials are also believed to be suitably usable in etching silicon dioxide selectively relative to $Al_2O_3$. In the context of this document, "selective removal" refers to a removal rate of the material being removed at a rate of at least 2:1 to the material remaining.

Referring to FIG. 4, the substrate has again been exposed to the gaseous first precursor to form a $HfCl_x$ first species monolayer 18 which is illustrated as adhering to the oxygen of the $HfO_x$ groups as well as to the previous unadhered sites of substrate material 14. The substrate could be subsequently exposed to the second gaseous precursor to form a second species monolayer of the desired composition of the material being formed. Processing might then continue by exposure of the substrate to the third gaseous substance to remove any subsequently formed undesired reaction product. Alternately or additionally, subsequent processing might be conducted which only constitutes repeated cycling of the gaseous first precursor and the gaseous second precursor to form a thicker layer of material. Further alternately by way of example only, alternate or different alternating deposition precursors might be utilized, or switching to a deposition mode having a film growth rate which is a non-ALD process regime and approximates more that of a chemical vapor deposition process scheme.

Figure 4:
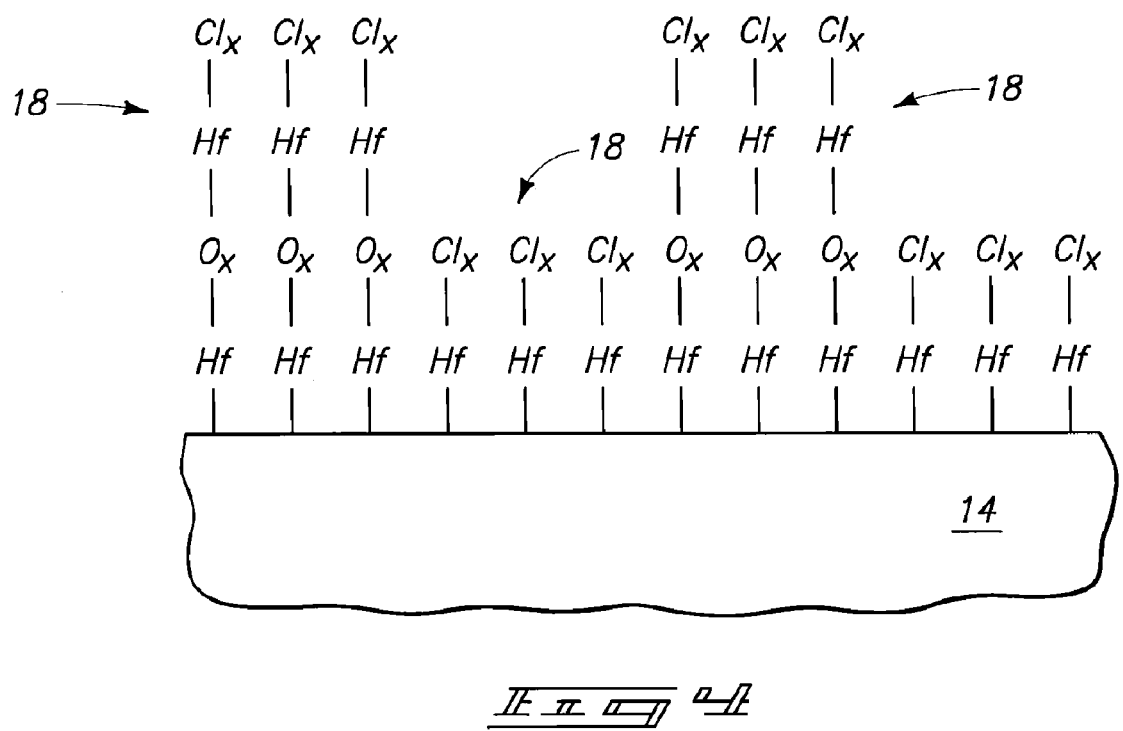
FIG. 4 is a view of the FIG. 3 substrate at a processing step subsequent to that shown by FIG. 3.

FIG. 4 might be considered as illustrating the $HfCl_x$ precursor as having an essential equal affinity to chemisorb to sites of substrate 14 and monolayer 16. In one preferred implementation, the first gaseous precursor (for example here $HfCl_x$) during the repeated chemisorbing preferentially adsorbs to substrate material other than the second species monolayer. For example, the $HfCl_x$ might have greater affinity to adsorb to, and therefor preferentially adsorbs to, substrate material 14 (i.e., silicon) than to second species monolayer material 16 (i.e., $HfO_x$). In the context of this document, a preferential adsorption to one material vs. another material is at any atomic deposition ratio which is greater than 1:1. In one preferred implementation, the preferential adsorbing is at a ratio of at least 2:1. In other words in the illustrated example, twice as many $HfCl_x$ molecular species would adhere to substrate material 14 as would adhere to the $HfO_x$ material of monolayer 16 over some given initial time period. Of course even with such a preferential adsorbing rate, the substrate might be exposed to the precursor a sufficient period of time that substantial saturation occurs and/or the preferential adsorbing effect is not seen/apparent in the monolayer at the conclusion of that cycle of exposure to the precursor.

The invention also contemplates a method of forming material on a substrate independent or regardless of forming a discontinuous first species monolayer. Specifically in one implementation, a substrate is positioned within a deposition chamber. A first species monolayer is chemisorbed onto the substrate within the chamber from some gaseous precursor "a". The substrate having a first species monolayer is exposed to some gaseous precursor "b" different from precursor "a" effective to react with the first species to form a second species monolayer, with such exposing leaving some undesired impurity on the substrate. By way of example only and with respect to $HfO_2$ and $Al_2O_3$ formation, any of the above-described examples are contemplated independent of continuous/saturated vs. discontinuous first species monolayer formation, and independent of a reaction product forming from underlying substrate.

Regardless, the substrate having the undesired impurity is exposed to a gaseous substance "c" different from the precursors "a" and "b" effective to selectively remove the undesired impurity from the substrate relative to the second species monolayer. The gaseous substance "c" does not deposit material/another species onto the substrate. For example, consider the above-described deposition of $Al_2O_3$ from trimethylaluminum and any suitable oxygen species, and independent of whether complete or discontinuous coverage of the first species monolayer occurs. Consider that the exposure to a suitable oxygen containing species leaves carbon as an undesired impurity on the substrate after exposure to the oxygen containing species. Accordingly, the undesired impurity remaining on the substrate (some carbon containing species) is derived from the first species monolayer. An exemplary gaseous substance "c" different from the precursors "a" and "b" would be HF (or $CF_4$ plus $O_3$, or $F_2$ plus $O_3$) which would selectively remove the carbon containing species from the substrate selectively relative to the $Al_2O_3$ which was formed. Of course, alternate hydrogen halides, alternate halogen containing gases including alternate fluorine containing gaseous substances "c" might be utilized. Other alternate gaseous substances "c" are also of course contemplated. Further, gaseous substance "c" might be followed by a gaseous substance "d" (different from "a", "b" and "c") for example effective to remove any adverse reaction product from the substrate that might have been formed by exposure to "c", for example $SiO_2$ formed be exposure to oxygen in this specific example.

Further by way of example only, consider deposition of TiN from a gaseous first precursor comprising $TiCl_4$ and a gaseous second precursor comprising $NH_3$. A possible undesired impurity remaining on the substrate at the conclusion of exposure to the gaseous second precursor might include a chlorine containing species. An exemplary possible gaseous substance "c" which would be effective to selectively remove an undesired chlorine containing impurity from the substrate relative to a second species monolayer comprising TiN would include any of $H_2$, diborane and hydrazine. Accordingly, independent of discontinuous first species monolayer formation and independent of reaction of the second precursor with exposed underlying substrate material, the invention contemplates removal of an undesired impurity by exposure to a gaseous substance "c" different from the precursors "a" and "b" effective to selectively remove the undesired impurity from the substrate relative to the second species monolayer.

As the artisan will appreciate, any suitable temperatures, pressures, pulse times and flow rates might be utilizable in conjunction with the practice of the above-described preferred embodiments. By way of example only, typical preferred substrate temperatures will be anywhere from room temperature to 900° C., with a temperature range of from 100° C. to 600° C. being a more preferred example. Pressure will typically be subatmospheric, more preferably at or below 100 Torr, and most preferably at or below 20 Torr. Exemplary preferred pulse times for the subject exposure to the precursors and gaseous substances are anywhere from 0.2 second to 5 seconds, with less than or equal to 1.0 second being most preferred. Any suitable flow rates can be utilized for the respective gases and intermediate purge flows, or the absence of intermediate gas purge flows being utilized. Plasma could, of course, be utilized in any of the above-described processing, and whether generated within the deposition chamber or remote therefrom.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of forming a field effect transistor gate oxide on a substrate, comprising:
    positioning a substrate within a deposition chamber;
    chemisorbing a first metal containing species monolayer onto the substrate within the chamber from a gaseous first precursor, the first metal containing species monolayer being discontinuously formed over the substrate;
    exposing the substrate having the discontinuous first metal containing species monolayer to a gaseous oxygen containing second precursor different from the first precursor effective to react with the first metal containing species to form a second species monolayer; and
    after exposing to the gaseous oxygen containing second precursor, exposing the substrate to a halogen containing third gaseous substance comprising a hydrogen halide different from the first and second precursors effective to selectively remove a silicon oxide reaction product from the substrate relative to the second species monolayer.

2. The method of claim 1 wherein silicon dioxide is formed from reaction of the gaseous oxygen containing second precursor with silicon substrate material.

3. The method of claim 1 wherein the halogen comprises fluorine.

4. The method of claim 1 wherein the oxide reaction product is formed by reaction of the second precursor with substrate not covered by the first metal-containing species monolayer, and wherein the oxide reaction product and the second species each comprises a dioxide.

5. The method of claim 1 wherein the oxide reaction product is formed by reaction of the second precursor with substrate not covered by the first metal-containing species monolayer comprises a dioxide and the second species monolayer comprises an oxide other than a dioxide.

6. The method of claim 1 wherein the gaseous first precursor and the first metal containing species monolayer comprise hafnium, and a second metal oxide monolayer comprises an oxide of hafnium.

7. The method of claim 1 wherein the gaseous first precursor and the first metal containing species monolayer comprise aluminum, and a second metal oxide monolayer comprises an oxide of aluminum.

8. The method of claim 1 further comprising after conducting a cycle of the chemisorbing, the exposing to the gaseous oxygen containing second precursor and the exposing to the halogen containing third gaseous substance, exposing the substrate to the first gaseous precursor, then the second gaseous precursor and without exposing the substrate to the third gaseous substance for at least one cycle.

* * * * *